(12) United States Patent
Zhao et al.

(10) Patent No.: US 12,207,507 B2
(45) Date of Patent: Jan. 21, 2025

(54) DISPLAY WITH OVERLAPPING SIGNAL LINES ON DIFFERENT LAYERS AND SHIELDING LAYER THEREBETWEEN

(71) Applicant: BOE Technology Group Co., Ltd., Beijing (CN)

(72) Inventors: Fangyuan Zhao, Beijing (CN); Yangbing Li, Beijing (CN); Peng Jia, Beijing (CN); Yunke Qin, Beijing (CN); Lei Wang, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 631 days.

(21) Appl. No.: 17/486,775

(22) Filed: Sep. 27, 2021

(65) Prior Publication Data
US 2022/0165835 A1  May 26, 2022

(30) Foreign Application Priority Data
Nov. 20, 2020 (CN) .......................... 202011311454.2

(51) Int. Cl.
*H10K 59/131* (2023.01)
*H10K 50/86* (2023.01)
*H10K 59/60* (2023.01)

(52) U.S. Cl.
CPC ......... *H10K 59/131* (2023.02); *H10K 50/865* (2023.02); *H10K 59/60* (2023.02)

(58) Field of Classification Search
CPC .... H10K 59/131; H10K 50/865; H10K 59/60; H10K 59/126; H10K 59/65; H10K 59/00
See application file for complete search history.

(56) References Cited

U.S. PATENT DOCUMENTS

| | | | |
|---|---|---|---|
| 9,921,433 B2* | 3/2018 | Choi | G02F 1/134309 |
| 2005/0212916 A1* | 9/2005 | Nakamura | G06F 3/0412 |
| | | | 348/207.99 |
| 2019/0181155 A1* | 6/2019 | Li | H10K 59/131 |
| 2019/0273095 A1* | 9/2019 | Inada | H01L 27/124 |

* cited by examiner

*Primary Examiner* — Benjamin P Sandvik
*Assistant Examiner* — John Patrick Cornely
(74) *Attorney, Agent, or Firm* — IPro, PLLC

(57) ABSTRACT

Disclosed are a display substrate, a display panel and a display apparatus. The display substrate includes a base substrate; a plurality of read signal lines, extending on the base substrate in a first direction; a plurality of display signal lines, extending on the base substrate in a second direction, the second direction intersects with the first direction, the plurality of display signal lines and the plurality of read signal lines are arranged on different layers, there is an overlapped region between an orthographic projection of the plurality of display signal lines on the base substrate and an orthographic projection of the plurality of read signal lines; and a shielding layer, located between a layer where the plurality of read signal lines are and a layer where the plurality of display signal lines are, an orthographic projection of the shielding layer on the base substrate at least covers the overlapped region.

12 Claims, 6 Drawing Sheets

DISPLAY WITH OVERLAPPING SIGNAL LINES ON DIFFERENT LAYERS AND SHIELDING LAYER THEREBETWEEN

CROSS-REFERENCE TO RELATED APPLICATION

This application is based on and claims priority under 35 U.S.C 119 to Chinese Patent Application No. 202011311454.2, filed on Nov. 20, 2020, in the China National Intellectual Property Administration. The entire disclosure of the above application is incorporated herein by reference.

FIELD

The present disclosure relates to the technical field of display, in particular to a display substrate, a display panel and a display apparatus.

BACKGROUND

In today's world, a mobile phone has become an essential electronic device in daily life of people. The mobile phone integrates various functions such as work, communication and entertainment, and plays a very important role in everyone's life.

Along with the scientific and technological progress, the mobile phone becomes a mobile phone used in any time at anywhere from an old-fashioned fixed-line phone, and in order to improve the portability, the mobile phone is made smaller and smaller and a screen is made larger and larger from a palm phone to an existing ultra-thin mobile phone. Meanwhile, many more-convenient functions such as fingerprint recognition are added. Fingerprint recognition is one of current important user authentication modes, whether a user is a mobile phone owner or not is recognized by detecting the fingerprint of the user, and thus the user can open a mobile phone protection lock only by pressing the finger without inputting passwords to achieve payment and other functions.

Optical fingerprint recognition is one of fingerprint image acquisition methods. The principle of optical fingerprint recognition is shown as follows: when the finger is put above a display product, light emitted by a light source of the display product irradiates the valley and ridge positions of the finger, is reflected through the valley and ridge positions of the finger, and then comes in an optical fingerprint recognition device. As the reflection light intensity of the valley position and the reflection light intensity of the ridge position are different, a photosensor generates different electric signals according to the difference between the reflection light intensity of the valley position and the reflection light intensity of the ridge position, so that fingerprint recognition is achieved.

SUMMARY

Accordingly, an embodiment of the present disclosure provides a display substrate, including:
  a base substrate;
  a plurality of read signal lines, extending on the base substrate in a first direction;
  a plurality of display signal lines, extending on the base substrate in a second direction, wherein the second direction intersects with the first direction, the plurality of display signal lines and the plurality of read signal lines are arranged on different layers, and there is an overlapped region between an orthographic projection of the plurality of display signal lines on the base substrate and an orthographic projection of the plurality of read signal lines; and
  a shielding layer, located between a layer where the plurality of read signal lines are located and a layer where the plurality of display signal lines are located, wherein an orthographic projection of the shielding layer on the base substrate at least covers the overlapped region.

Optionally, in the above display substrate provided by embodiments of the present disclosure, the shielding layer includes a plurality of shielding portions which are mutually dependent, and an orthographic projection of each shielding portion on the base substrate completely covers an orthographic projection of a corresponding read signal line.

Optionally, in the above display substrate provided by embodiments of the present disclosure, the plurality of display signal lines include a plurality of first display signal lines located between the base substrate and the layer where the plurality of read signal lines are located, and a plurality of second display signal lines located on one side of the layer where the plurality of read signal lines are located facing away from the base substrate; and
  the shielding portions include first sub-portions and/or second sub-portions; wherein the first sub-portions are located between a layer where the plurality of first display signal lines are located and the layer where the plurality of read signal lines are located, and the second sub-portions are located between a layer where the plurality of second display signal lines are located and the layer where the plurality of read signal lines are located.

Optionally, in the above display substrate provided by embodiments of the present disclosure, the shielding portions include the first sub-portions and the second sub-portions; wherein the first sub-portions and the second sub-portions are electrically connected, and an orthographic projection of the second sub-portions on the base substrate is located in an orthographic projection of the first sub-portions.

Optionally, the above display substrate provided by embodiments of the present disclosure further includes a first insulating layer located between a layer where the first sub-portions are located and the layer where the plurality of read signal lines are located, and a second insulating layer located between a layer where the second sub-portions are located and the layer where the plurality of read signal lines are located; and
  the first sub-portions and the second sub-portions are electrically connected through at least one through hole penetrating through the first insulating layer and the second insulating layer.

Optionally, in the above display substrate provided by embodiments of the present disclosure, there are a plurality of through holes, and the plurality of through holes are formed in edges of two sides of an extending direction of the read signal lines respectively.

Optionally, in the above display substrate provided by embodiments of the present disclosure, the base substrate includes a display region and a bezel region located around the display region; and the plurality of through holes are at least formed in the bezel region.

Optionally, in the above display substrate provided by embodiments of the present disclosure, the plurality of through holes are formed in the display region and the bezel region; wherein the through holes in the display region are located in two sides of the overlapped region, and a length of the through holes in the display region is equal to a length of the overlapped region in the first direction.

Optionally, in the above display substrate provided by embodiments of the present disclosure, the first display signal lines include a gate line, an initialization signal line, a reset signal line and a high-level power line, and the second display signal lines include an anode route; wherein
  the gate line and the initialization signal line are arranged on the same layer, and the reset signal line and the high-level power line are arranged on the same layer; and
  a layer where the reset signal line is located is between the layer where the gate line is located and the layer where the plurality of read signal lines are located.

Optionally, the above display substrate provided by embodiments of the present disclosure further includes a photosensor located on one side of the layer where the plurality of read signal lines are located facing away from the base substrate, and a transistor located between the base substrate and the layer where the plurality of read signal lines are located; the transistor includes a gate arranged on the same layer with the gate lines, and a source and a drain located on one side of the gate facing away from the base substrate; and
  the plurality of read signal lines, the source and the drain are arranged on the same layer, the first sub-portions are located between the layer where the reset signal line is located and the layer where the source and the drain are located, and the second sub-portions are located between the layer where the source and the drain are located and a layer where the photosensor is located.

Optionally, the above display substrate provided by embodiments of the present disclosure further includes the photosensor located on one side of the layer where the plurality of read signal lines are located facing away from the base substrate, and the transistor located between the base substrate and the layer where the plurality of read signal lines are located; wherein
  the photosensor includes a first electrode, a photoelectric conversion layer and a second electrode sequentially arranged on one side of the layer where the plurality of read signal lines are located facing away from the base substrate in a stacked mode; and
  the first sub-portions are located between the transistor and the layer where the plurality of read signal lines are located, and the second sub-portions and the first electrode are arranged on the same layer.

Optionally, the above display substrate provided by embodiments of the present disclosure further includes a photosensor located on one side of the layer where the plurality of read signal lines are located facing away from the base substrate;
  the plurality of display signal lines are located on one side of a layer where the photosensor is located facing away from the base substrate; and
  the shielding layer is arranged between the layer where the photosensor is located and the layer where the plurality of display signal lines are located on the whole face.

Based on the same inventive concept, an embodiment of the present disclosure provides a display panel, including the above display substrate.

Based on the same inventive concept, an embodiment of the present disclosure provides a display apparatus, including the display panel.

DETAILED DESCRIPTION OF THE EMBODIMENTS

Figure 1:
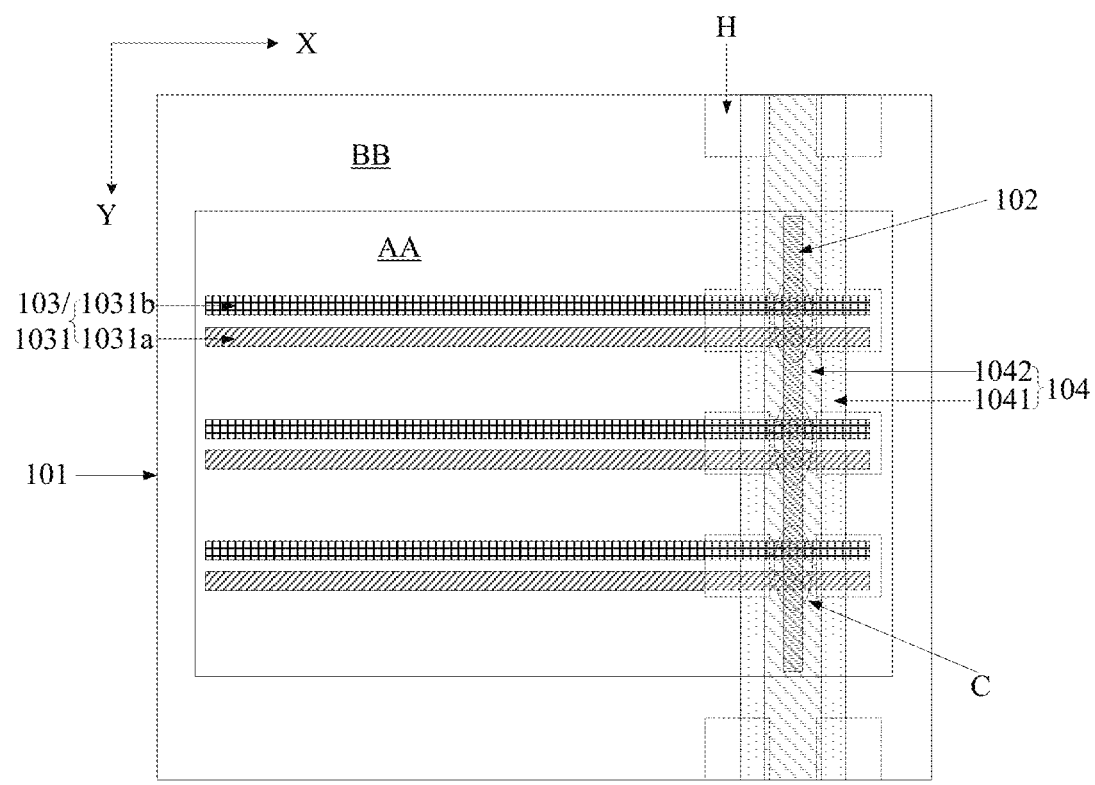
FIG. 1 is a schematic diagram of a plane structure of a display substrate provided by an embodiment of the present disclosure.

In order to make the objectives, technical solutions and advantages of the embodiments of the present disclosure clearer, the technical solutions of the embodiments of the present disclosure will be clearly and completely described with reference to the accompanying drawings of the embodiments of the present disclosure below. It needs to be noted that the shape and size of graphs in the accompanying drawings do not reflect true scales, and are only intended to schematically illustrate the content of the present disclosure. Numbers which are same or similar all the way indicate same or similar elements or elements with same or similar functions. Apparently, the described embodiments are only part of the embodiments of the present disclosure, not all of them. Based on the described embodiments of the present disclosure, all other embodiments obtained by those of ordinary skill in the art without creative work shall fall within the protection scope of the present disclosure.

Unless otherwise defined, the technical terms or scientific terms used here shall have common meanings understood by those of ordinary skill in the art to which the present disclosure belongs. The terms "first", "second" and similar words used in the specification and claims of the present disclosure do not indicate any order, quantity or importance, but are only used to distinguish different components. "Include" or "comprise" and other similar words mean that an element or item appearing before the word covers an element or item listed after the word and their equivalents, but does not exclude other elements or items. "Inner", "Outer", "Upper", "Lower", etc. are only used to indicate the relative position relationship. After an absolute position of a described object changes, the relative position relationship may also change accordingly.

In optical fingerprint recognition, a photosensor (sensor) is needed to detect optical signals reflected on a finger, and thus fingerprints are obtained to achieve fingerprint recognition. An in-cell solution and an off-screen solution may be obtained through division according to the position of the photosensor. According to the off-screen optical fingerprint recognition solution, a screen emits light, the light irradiates the finger, then an image of the finger passes through an organic light emitting display (OLED) to be collected by an optical sensor below the screen, and the fingerprint image is obtained. But when the light passes through the display screen, as many films absorb or reflect the light, the signal quantity received on the photosensor is small, and clear imaging of the photosensor is interfered. According to the in-cell optical fingerprint recognition solution, the photosensor is integrated in the display screen, the photosensor and the display screen share the same substrate, thus, the number of film structures through which the light penetrates from the finger to the photosensor may be reduced, the signal quantity is increased, as only one substrate is needed, the thickness of the screen may be effectively reduced, and the whole becomes thinner. But as the photosensor and the display device are made on the same substrate, a circuit structure is complex, and interference between different signal lines is generated.

As for the fingerprint recognition technology, it is very important to obtain clear fingerprint imaging, and high noise will cause unclear fingerprints, and also may affect imaging of the position where signal light is weak. By combining pixel circuit simulation and actual measurement results, it is positioned that a noise source to a large degree is interference between signals. As stray capacitance (RC-loading) exists between different signal lines, electric signals loaded on different signal lines may couple alternating noise on other signal lines. The alternating noise on the read signal lines (Read line) for obtaining fingerprint recognition electric signals may greatly interfere with finally-collected fingerprint recognition electric signals, and thus the fingerprint imaging area is small and imaging is unclear.

Figure 2:
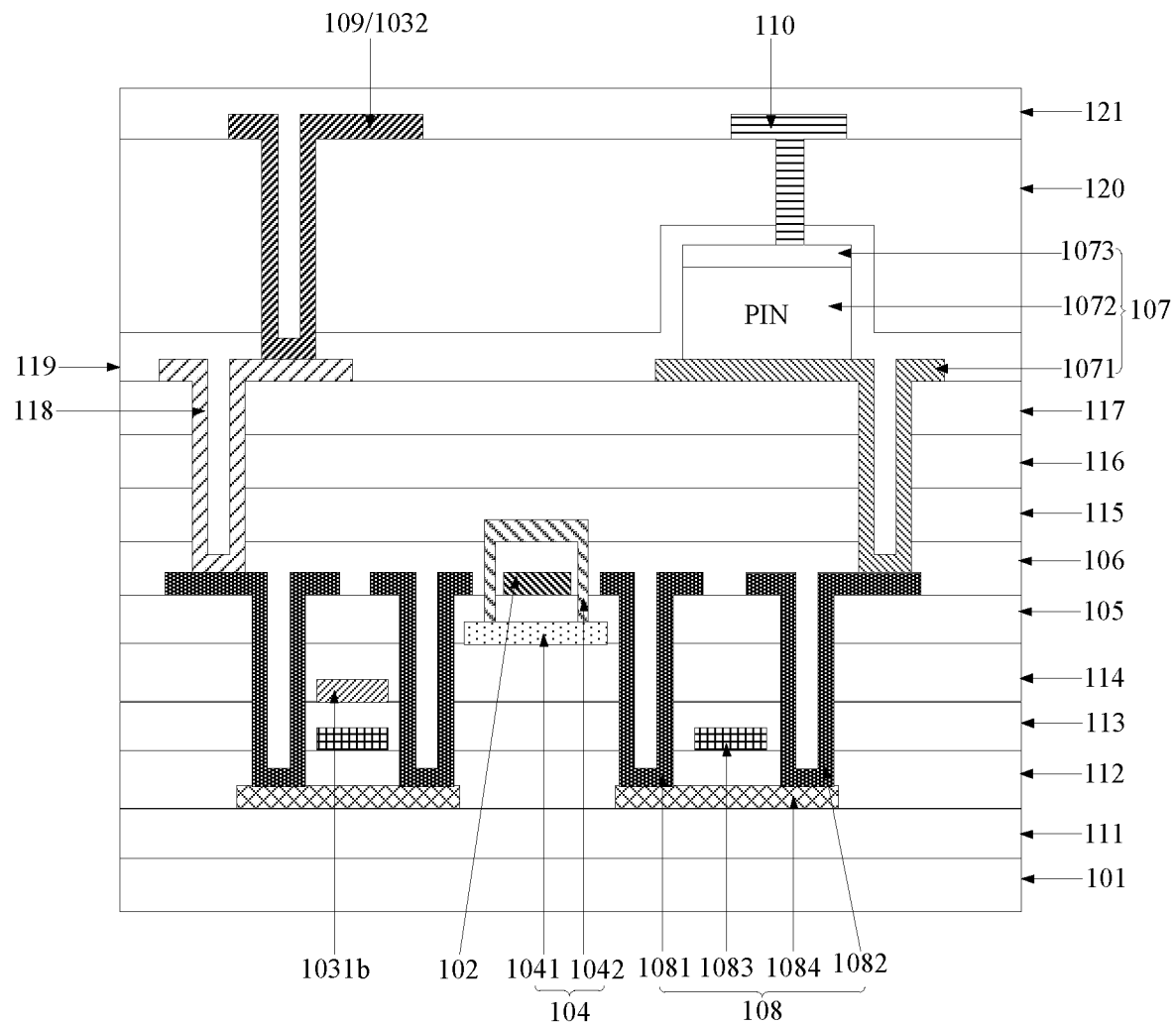
FIG. 2 is a schematic diagram of a sectional structure of a display substrate provided by an embodiment of the present disclosure.

As for the above problems in related technologies, an embodiment of the present disclosure provides a display substrate, as shown in FIG. 1 and FIG. 2, includes:
  abase substrate 101;
  a plurality of read signal lines 102, extending on the base substrate 101 in a first direction Y;
  a plurality of display signal lines 103, extending on the base substrate 101 in a second direction X, wherein the second direction X intersects with the first direction Y, the plurality of display signal lines 103 and the plurality of read signal lines 102 are arranged on different layers, and an orthographic projection of the plurality of display signal lines 103 on the base substrate 101 and an orthographic projection of the plurality of read signal lines 102 have an overlapped region C; and
  a shielding layer 104, located between a layer where the plurality of read signal lines 102 are located and a layer where the plurality of display signal lines 103 are located, wherein an orthographic projection of the shielding layer 104 on the base substrate 101 at least covers the overlapped region C.

In the above display substrate provided by embodiments of the present disclosure, the read signal lines 102 are used for reading electric signals of fingerprint recognition, the shielding layer 104 is arranged between the read signal lines 102 and the display signal lines 103, the shielding layer 104 may effectively isolate signals on the display signal lines 103 so as to prevent the signals from interfering with the read signal lines 102, thus, noise is reduced, the signal-to-noise ratio is increased, the large signal-to-noise ratio indicates that the ratio of useful signals in collected signals is large, the finally-collected fingerprint imaging area is large, and the definition is high. Thus, the definition of fingerprint recognition is improved while a display function is guaranteed.

Optionally, in the above display substrate provided by embodiments of the present disclosure, in order to achieve a shielding effect of the shielding layer 104, a material of the shielding layer 104 may be copper, molybdenum, aluminum and other metal materials with shielding properties or indium tin oxide and other transparent conductive materials. During specific implementation, the shielding layer 104 may be arranged in a suspended mode (not load signals) or may be arranged to load direct signals. Optionally, the direct current signals may be high-level (VDD) signals, low-level (VSS) signals, initialization (Vin) signals, bias voltage (Vbias) signals and the like. In order to guarantee a good shielding effect, the shielding layer 104 loads the direct current signals preferably. The specific reason is as follows: alternating noise on the read signal lines 102 in the related technologies is introduced through stray capacitance, after the shielding layer 104 is added, shake (namely, alternating noise) brought by the stray capacitance is firstly introduced to the shielding layer 104, meanwhile, fixed potential is added to the shielding layer 104 to guarantee charge change output caused by the shake, voltages on the shielding layer 104 are stabilized, influences on the shielding layer 104 are reduced, and thus it is guaranteed that flow of charge in the read signal lines 102 is not affected by the shielding layer 104.

In some embodiments, a first pixel driving circuit of the photosensor and a second pixel driving circuit of a light-emitting device are simultaneously formed on the base substrate 101, under this condition, same films in the first pixel driving circuit and the second pixel driving circuit will be shared, display and collection may not be separated, and thus key routes-read signal lines 102 which are easily interfered and greatly affect output of the fingerprint recognition electric signals may be subjected to electromagnetic shielding one by one.

Figure 3:
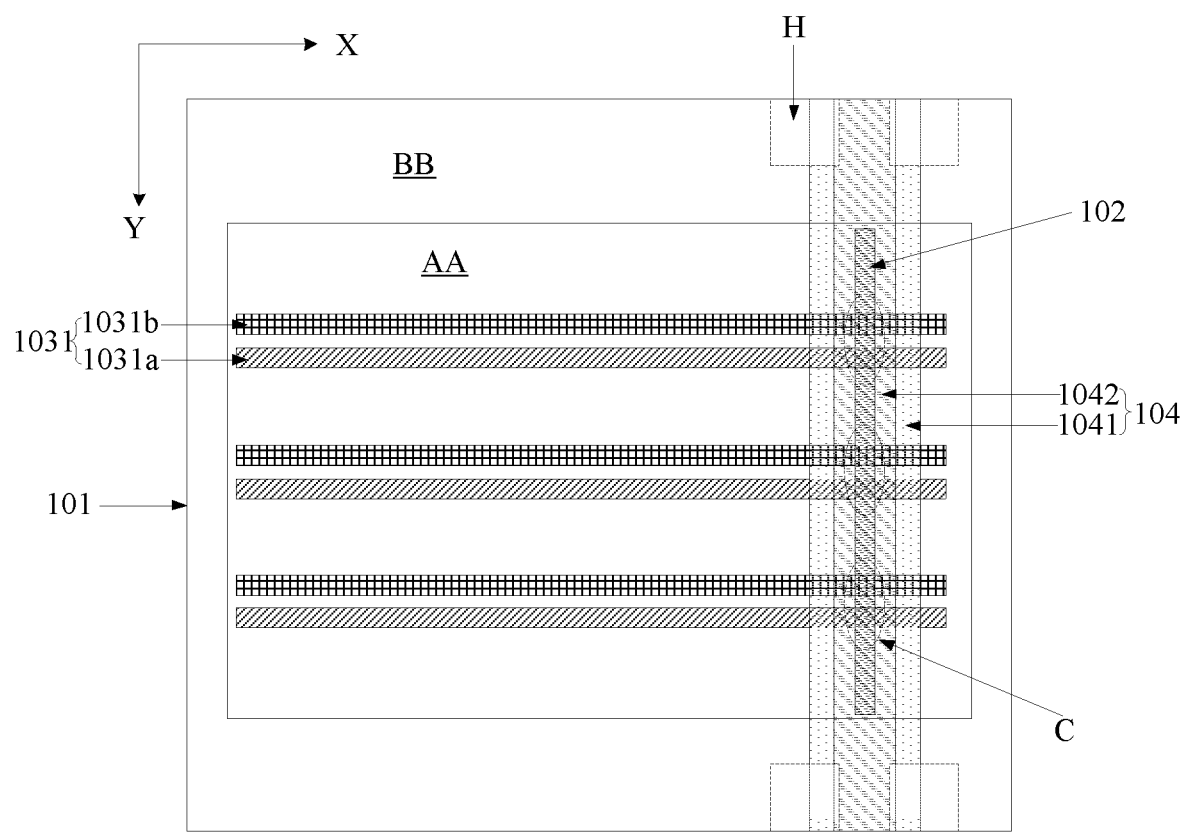
FIG. 3 is a schematic diagram of another plane structure of a display substrate provided by an embodiment of the present disclosure.

Based on this, in the above display substrate provided by embodiments of the present disclosure, as shown in FIG. 1 and FIG. 3, the shielding layer 104 may include a plurality of mutually-independent shielding portions (one shielding portion is specifically shown in FIG. 1 and FIG. 3), and an orthographic projection of each shielding portion on the base substrate 101 correspondingly and completely covers an orthographic projection of one read signal line 102.

It shall be understood that in order to conform to a light and thin development trend, the shielding layer 104 in the present disclosure does not need to be thick as long as the shielding layer 104 may achieve the effect of shielding display signal interference, and during specific implementation, under the condition of clear actual fingerprint imaging, a thickness of the shielding layer 104 is as small as possible. As a line width of the shielding portions with a small thickness is large compared with a line width of the read signal lines 102, a product appearance observed through human eyes may not be affected.

Figure 4:
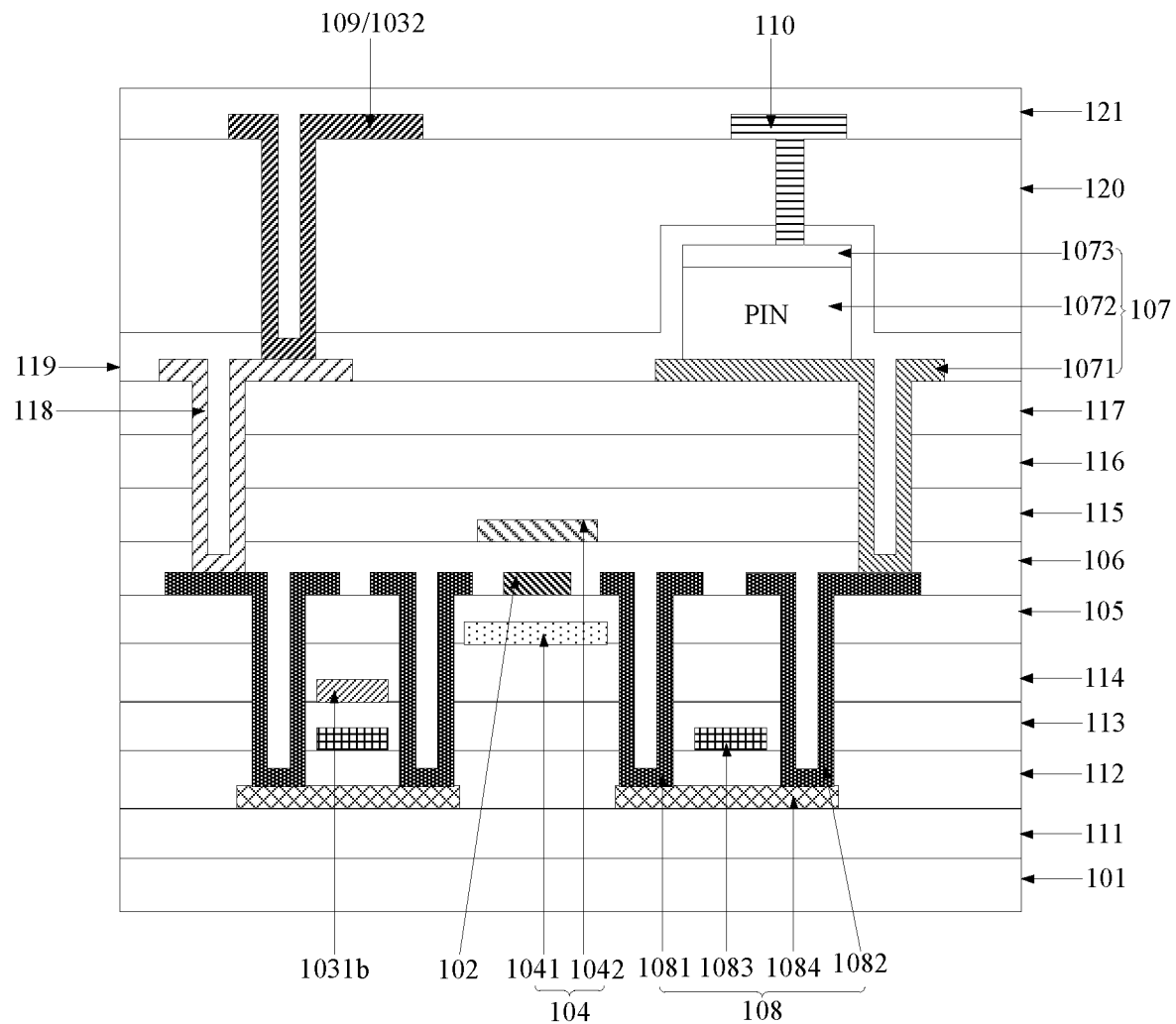
FIG. 4 is a schematic diagram of another sectional structure of a display substrate provided by an embodiment of the present disclosure.

Optionally, in the above display substrate provided by embodiment of the present disclosure, as shown in FIG. 1 and FIG. 4, the plurality of display signal lines 103 may include a plurality of first display signal lines 1031 located between the base substrate 101 and the layer where the plurality of read signal lines 102 are located, and a plurality of second display signal lines 1032 located on one side of the layer where the plurality of read signal lines 102 are located facing away from the base substrate 101; the shielding portions may include first sub-portions 1041 and/or second sub-portions 1042; wherein the first sub-portions 1041 are located between a layer where the plurality of first display signal lines 1031 are located and the layer where the plurality of read signal lines 102 are located, and the second sub-portions 1042 are located between a layer where the plurality of second display signal lines 1032 are located and the plurality of read signal lines 102. Thus, interference of the first display signal lines 1031 and interference of the second display signal lines 1032 may be shielded by the first sub-portions 1041 and the second sub-portions 1042 located on upper sides and lower sides of the plurality of read signal lines 102 respectively.

Optionally, in the above display substrate provided by embodiments of the present disclosure, as shown in FIG. 1 and FIG. 4, the shielding portions include the first sub-portions 1041 and the second sub-portions 1042; wherein the first sub-portions 1041 and the second sub-portions 1042 are electrically connected, and an orthographic projection of the second sub-portions 1042 on the base substrate 101 is located in an orthographic projection of the first sub-portions 1041.

Due to the arrangement, the first sub-portions 1041 and the second sub-portions 1042 surround the read signal lines 102, interference of the first display signal lines 1031 and interference of the second display signal lines 1032 on the upper sides and the lower sides of the read signal lines 102 may be effectively shielded, as the first sub-portions 1041 are wider than the second sub-portions 1042, a position, right opposite to the display signal lines 103, of the shielding layer 104 does not have a notch, interference of the display signal lines 103 may be prevented from coming in from the notch, and the signal-to-noise ratio is further increased.

Optionally, the above display substrate provided by embodiments of the present disclosure, as shown in FIG. 1 and FIG. 4, further may include: a first insulating layer 105 located between a layer where the first sub-portions 1041 are located and the layer where the plurality of read signal lines 102 are located, and a second insulating layer 106 located between a layer where the second sub-portions 1042 are located and the layer where the plurality of read signal lines 102 are located; and the first sub-portions 1041 and the second sub-portions 1042 specifically may be electrically connected through at least one through hole H penetrating through the first insulating layer 105 and the second insulating layer 106.

During specific implementation, the first sub-portions 1041 and the first insulating layer 105 may be manufactured in sequence before the plurality of read signal lines 102 are manufactured; and the second insulating layer 106, the through holes H penetrating through the first insulating layer 105 and the second insulating layer 106 and the second sub-portions 1042 are manufactured in sequence after the plurality of read signal lines 102 are manufactured, and thus the second sub-portions 1042 and the first sub-portions 1041 are electrically connected.

Optionally, in the above display substrate provided by embodiments of the present disclosure, as shown in FIG. 1 and FIG. 3, there are many through holes H, and all the through holes H are formed in edges of two sides of the reading signal lines 102 respectively. Specifically, the base substrate 101 includes a display region AA, and a bezel region BB located around the display region AA; and all the through holes H may be at least formed in the bezel region BB. The through holes H are only formed in the bezel region BB, the number of the through holes H may be remarkably reduced, and it is guaranteed that a larger space exists for displayed and collected pixel circuit routing.

Optionally, in the above display substrate provided by embodiments of the present disclosure, as shown in FIG. 1, all the through holes H may be formed in the display region AA and the bezel region BB; wherein the through holes H in the display region AA are located in two sides of the overlapped region C; and a length of the through holes H in the display region AA is equal to a length of the overlapped region C in the first direction X. Thus, it may be guaranteed that the position, right opposite to the display signal lines 103, of the shielding layer 104 does not have the notch, interference of the display signal lines 103 may be prevented from entering from the notch, and the signal-to-noise ratio is effectively increased.

Optionally, the first display signal lines 1031 may include gate lines 1031a, initialization signal lines, reset signal lines 1031b and high-level power lines, and the second display signal lines 1032 may include anode routes; wherein the gate lines 1031a and the initialization signal lines are arranged on the same layer, and the reset signal lines 1031b and the high-level power lines are arranged on the same layer; and a layer where the reset signal lines 1031b are located is located between the layer where the gate lines 1031a are located and the layer where the plurality of read signal lines 102 are located. In some embodiments, the gate lines 1031a and the initialization signal lines arranged on the same layer may be located on a layer where a gate 1083 of a transistor is located, the reset signal lines 1031b and the high-level power lines arranged on the same layer may be located between the layer where the gate 1083 of the transistor is located and a layer where a source 1081 is located, and the anode routes and an anode 109 may be arranged on the same layer.

Optionally, the above display substrate provided by embodiments of the present disclosure, as shown in FIG. 1 and FIG. 4, further may include the photosensor 107 located on one side of the layer where the plurality of read signal lines 102 are located facing away from the base substrate 101, and the transistor 108 located between the base substrate 101 and the layer where the plurality of read signal lines 102 are located; the transistor 108 includes the gate 1083 arranged on the same layer with the gate lines 1031a, and the source 1081 and a drain 1082 located on one side of the gate 1083 facing away from the base substrate 101; and the plurality of read signal lines 102, the source 1081 and the drain 1082 may be arranged on the same layer, the first sub-portions 1041 may be located between the layer where the reset signal lines 1031b are located and the layer where the source 1081 and the drain 1082 are located, and the second sub-portions 1042 may be located between the layer where the source 1081 and the drain 1082 are located and a layer where the photosensor 107 is located. As the read signal lines 102, the source 1081 and the drain 1082 share the same layer, the number of layers of needed masks is reduced, the process difficulty is reduced, and the cost is reduced.

Figure 5:
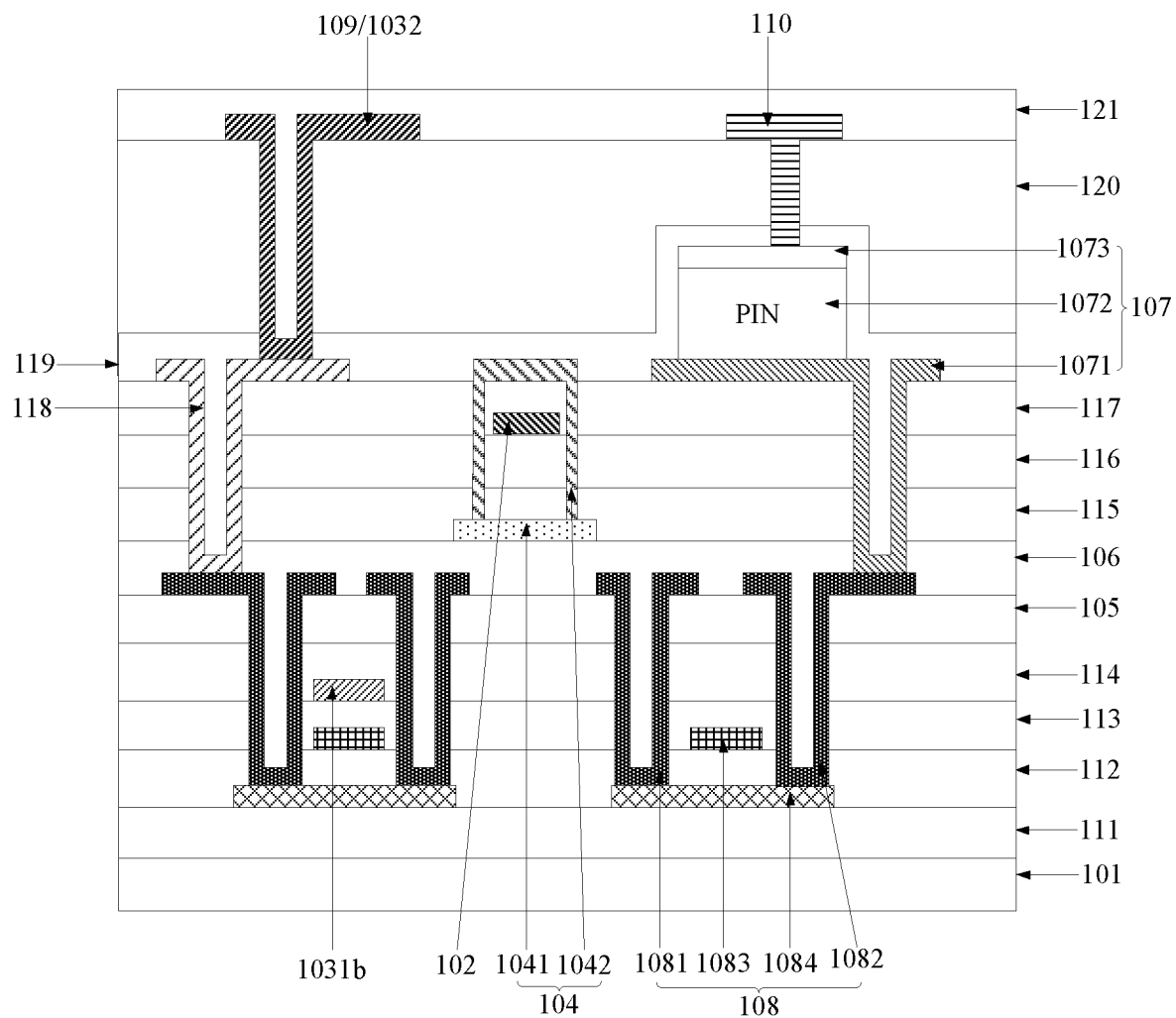
FIG. 5 is a schematic diagram of further sectional structure of a display substrate provided by an embodiment of the present disclosure.

In consideration of the situation that routes of pixel driving circuits in some products are intensive, the first sub-portions 1041 and the read signal lines 102 may be independently arranged, as shown in FIG. 5, the read signal lines 102 specifically may be arranged between the layer where the transistor 108 is located and the layer where the photosensor 107 is located, the first sub-portions 1041 are arranged between the layer where the transistor 108 is located and the layer where the read signal lines 102 are located, and the second sub-portions 1042 and a first electrode 1071 of the photosensor 107 may be arranged on the same layer. As the second sub-portions 1042 and the first electrode 1071 share the same layer, the number of layers of the needed masks is reduced, the process difficulty is reduced, and the cost is reduced.

Optionally, the photosensor 107 in the present disclosure may include the first electrode 1071, a photoelectric conversion layer 1072 and a second electrode 1073 sequentially arranged on one side of the layer where the plurality of read signal lines 102 are located facing away from the base substrate 101 in a stacked mode; wherein the photoelectric conversion layer 1072 may be of a PIN structure, and specifically includes a P type semiconductor layer, an intrinsic semiconductor layer and an N type semiconductor layer arranged in a stacked mode. Specifically, bias signals may be provided for the second electrode 1073 of the photosensor 107 through bias signal lines 110. The transistor 108 may be an amorphous-silicone thin-film transistor, a low-temperature polycrystalline silicone transistor or an oxide transistor, and may be a bottom gate type transistor or a top gate type transistor. FIG. 2 specifically shows the transistor 108 being the top gate type transistor, wherein an active layer 1084 is located below the gate 1083.

In some embodiments, a first pixel driving circuit of the photosensor is formed on the base substrate 101, a second pixel driving circuit of the light-emitting device is formed on one side of the photosensor facing away from the base substrate 101, under this condition, display and collection are distributed on different films, and thus it may be considered that the whole-face shielding layer 104 is added to enable display and collection to be free of interference.

Figure 6:
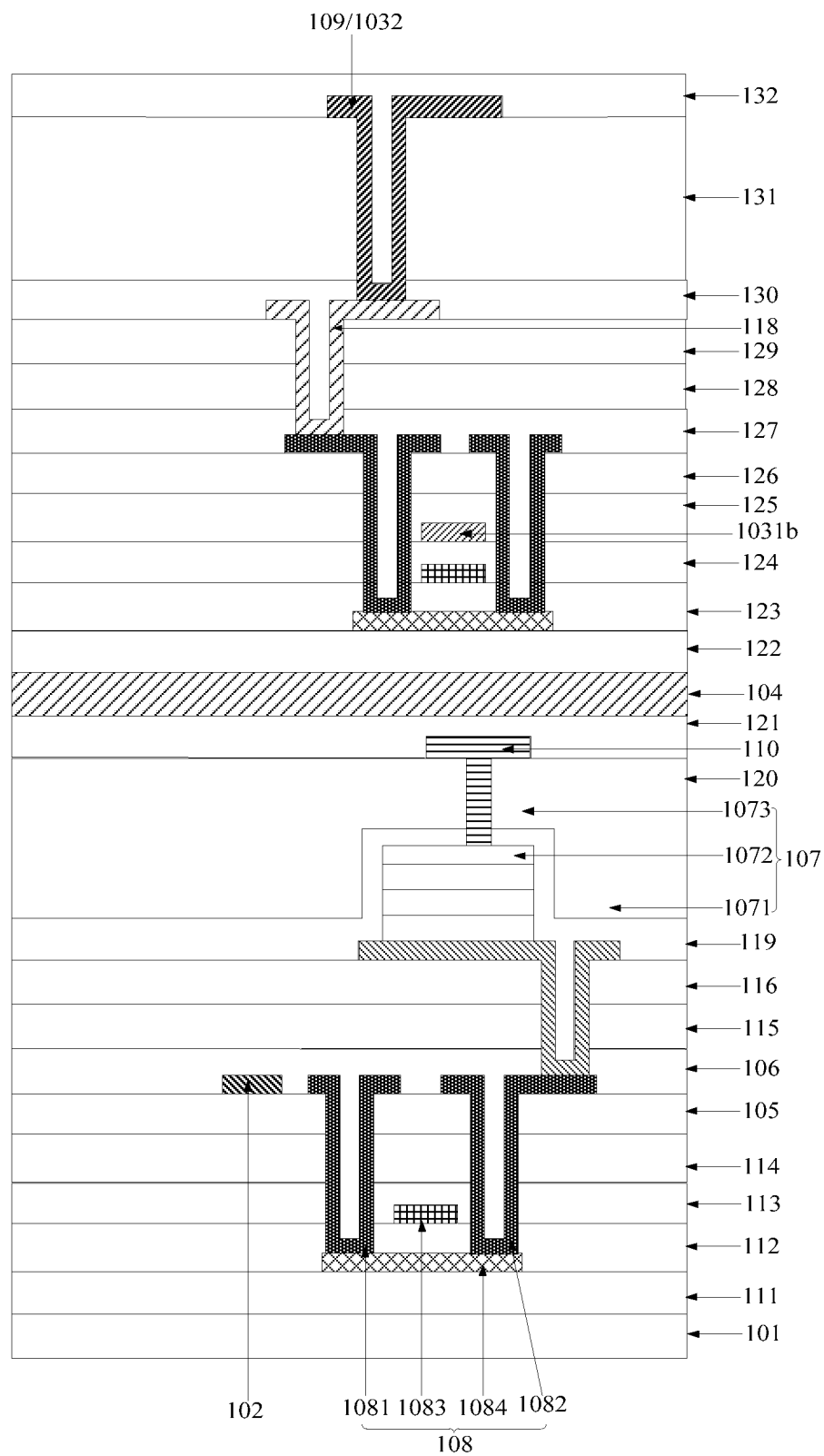
FIG. 6 is schematic diagram of yet further sectional structure of a display substrate provided by an embodiment of the present disclosure.

Based on this, the above display substrate provided by embodiments of the present disclosure, as shown in FIG. 6, further may include: the photosensor 107 located on one side of the layer where the plurality of read signal lines 102 are located facing away from the base substrate 101;

the plurality of display signal lines 103 are located on one side of a layer where the photosensor 107 is located facing away from the base substrate 101; and the shielding layer 104 is arranged between the layer where the photosensor 107 is located and the layer where the plurality of display signal lines 103 are located on the whole face.

In addition, under the condition that the first pixel driving circuit of the photosensor 107 and the second pixel driving circuit of the light-emitting device are simultaneously arranged on the base substrate 101, as shown in FIG. 2, FIG. 4 and FIG. 5, the display substrate provided by the present disclosure further may include: the bias signal lines 110 arranged on the same layer with the anode 109, a buffer layer 111, a first gate insulating layer 112, a second gate insulating layer 113, a first inter-layer dielectric layer 114, a first insulating layer 115, a second insulating layer 116, a third insulating layer 117, an adapter electrode 118 arranged on the same layer with the first electrode, a side wall protection layer 119, a first flat layer 120, a protection layer 121 multiplexed as a pixel defining layer, a light-emitting functional layer, a cathode, a packaging layer and the like, wherein and the light-emitting functional layer, the cathode and the packaging layer are not shown in the Figure and located on one side of the pixel defining layer facing away from the base substrate 101.

When the first pixel driving circuit of the photosensor 107 is arranged on the base substrate 101, and the second pixel driving circuit of the light-emitting device is arranged on one side of the photosensor 107 facing away from the base substrate 101, as shown in FIG. 6, the display substrate provided by the present disclosure further may include: the anode 109, the bias signal lines 110, the buffer layer 111, the first gate insulating layer 112, the second gate insulating layer 113, the first inter-layer dielectric layer 114, the first insulating layer 115, the second insulating layer 116, the side wall protection layer 119, the first flat layer 120, the protection layer 121, a second flat layer 122, a third gate insulating layer 123, a fourth gate insulating layer 124, a second inter-layer dielectric layer 125, a fourth insulating layer 126, a fifth insulating layer 127, a sixth insulating layer 128, a seventh insulating layer 129, an eighth insulating layer 130, the adapter electrode 118, a third flat layer 131, a pixel defining layer 132, a light-emitting functional layer, a cathode, a packaging layer and the like, wherein the light-emitting functional layer, the cathode and the packaging layer are not shown in the Figure and located on one side of the pixel defining layer 132 facing away from the base substrate 101.

Based on the same inventive concept, an embodiment of the present disclosure provides a display panel including the above display substrate provided by the embodiment of the present disclosure. As the principle for solving problems of the display panel is similar to the principle for solving problems of the display substrate, implementation of the display panel provided by the embodiment of the present disclosure may refer to implementation of the display substrate provided by the embodiment of the present disclosure, and repetitions are omitted here.

Optionally, the display panel may include: a plurality of pixel units arranged in the display region in an array, and each pixel unit may include a plurality of sub-pixels. Exemplarily, each pixel unit may include a read sub-pixel, a green sub-pixel and a blue sub-pixel, and thus color display may be achieved through mixing of red, green and blue. Alternatively, each pixel unit also may include a red sub-pixel, a green sub-pixel, a blue sub-pixel and a white sub-pixel, and thus color display may be achieved through mixing of red, green, blue and white. Of course, in actual application, light-emitting colors of the sub-pixels of each pixel unit may be designed and determined according to actual application environments, which is not limited herein.

Optionally, the display panel may be an organic light-emitting display panel, a quantum dot light-emitting diode or a micro-light-emitting diode display panel and other electroluminescent display panels. At this moment, the sub-pixels may include electroluminescent diodes and driving circuits for driving the electroluminescent diodes to emit light. The electroluminescent diodes include anodes, light-emitting layers and cathodes; and the driving circuits may include driving transistors, switching transistors and storage capacitors, and the specific structure and the working principle of the driving circuits may be the same as those in the prior art, which is not repeated here.

Based on the same inventive concept, an embodiment of the present disclosure further provides a display apparatus including the display panel provided by the embodiment of the present disclosure. The display apparatus may be a mobile phone, a tablet computer, a television, a display, a notebook computer, a digital photo frame, a navigator, a smart watch, a fitness wristband, a personal digital assistant and other any products or components with display functions. Other essential components of the display apparatus shall be understood by those of ordinary skill in the art, which is omitted here, and do not limit the present disclosure. In addition, as the principle of solving problems of the display apparatus is similar to the principle of solving problems of the display panel, implementation of the display apparatus may refer to the embodiment of the display panel, and repetitions are omitted here.

Some embodiments of the present disclosure provide the display substrate, the display panel and the display apparatus. The display substrate includes the base substrate; the plurality of read signal lines, extending on the base substrate in the first direction; the plurality of display signal lines, extending on the base substrate in the second direction, wherein the second direction intersects with the first direction, the plurality of display signal lines and the plurality of read signal lines are arranged on different layers, and the orthographic projection of the plurality of display signal lines on the base substrate and the orthographic projection of the plurality of read signal lines have the overlapped region; and the shielding layer, located between the layer where the plurality of read signal lines are located and the layer where the plurality of display signal lines are located, wherein the orthographic projection of the shielding layer on the base substrate at least covers the overlapped region. In the present disclosure, the read signal lines are used for reading electric signals of fingerprint recognition, the shielding layer is arranged between the read signal lines and the display signal lines, the shielding layer can effectively isolate signals on the display signal lines so as to prevent the signals from interfering with the read signal lines, and thus the definition of fingerprint recognition is improved while the display function is guaranteed.

Apparently, those skilled in the art can perform various changes and modifications on the present disclosure without departing from the spirit and scope of the present disclosure. Therefore, if these changes and modifications on the present disclosure fall in the scope of the claims of the present disclosure and their equivalent technologies, the present disclosure is also intended to contain these changes and modifications.

What is claimed is:

1. A display substrate, comprising:
   a base substrate;
   a plurality of read signal lines, extending on the base substrate in a first direction;
   a plurality of display signal lines, extending on the base substrate in a second direction, wherein the second direction intersects with the first direction, the plurality of display signal lines and the plurality of read signal lines are arranged on different layers, and there is an overlapped region between an orthographic projection of the plurality of display signal lines on the base substrate and an orthographic projection of the plurality of read signal lines; and
   a shielding layer arranged between a layer where the plurality of read signal lines are located and a layer where the plurality of display signal lines are located, wherein an orthographic projection of the shielding layer on the base substrate at least covers the overlapped region;
   wherein the shielding layer comprises a plurality of shielding portions which are mutually independent, and an orthographic projection of each of the shielding portions on the base substrate completely covers an orthographic projection of a corresponding read signal line;
   the plurality of display signal lines comprise a plurality of first display signal lines located between the base substrate and the layer where the plurality of read signal lines are located, and a plurality of second display signal lines located on one side of the layer where the plurality of read signal lines are located facing away from the base substrate; and the shielding portions comprise the first sub-portions and the second sub-portions, wherein the first sub-portions are located between a layer where the plurality of first display signal lines are located and the layer where the plurality of read signal lines are located, and the second sub-portions are located between a layer where the plurality of second display signal lines are located and the layer where the plurality of read signal lines are located;
   wherein the first sub-portions and the second sub-portions are electrically connected, and an orthographic projection of the second sub-portions on the base substrate is located in an orthographic projection of the first sub-portions;
   wherein the display substrate further comprises: a first insulating layer located between a layer where the first sub-portions are located and the layer where the plurality of read signal lines are located, and a second insulating layer located between a layer where the second sub-portions are located and the layer where the plurality of read signal lines are located; and the first sub-portions and the second sub-portions are electrically connected through at least one through hole penetrating through the first insulating layer and the second insulating layer.

2. The display substrate according to claim 1, wherein there are a plurality of through holes, and the plurality of through holes are formed in edges of two sides of an extending direction of the read signal lines respectively.

3. The display substrate according to claim 2, wherein the base substrate comprises a display region, and a bezel region located around the display region; and the plurality of through holes are at least formed in the bezel region.

4. The display substrate according to claim 3, wherein the plurality of through holes are formed in the display region and the bezel region; wherein the plurality of through holes in the display region are located in two sides of the overlapped region, and a length of the through holes in the display region is equal to a length of the overlapped region in the first direction.

5. The display substrate according to claim 1, wherein the first display signal lines comprise a gate line, an initialization signal line, a reset signal line and a high-level power line, and the second display signal lines comprise an anode route; wherein
   the gate line and the initialization signal line are arranged on a same layer, and the reset signal line and the high-level power line are arranged on a same layer; and
   a layer where the reset signal line is located is between a layer where the gate line is located and the layer where the plurality of read signal lines are located.

6. The display substrate according to claim 5, further comprising: a photosensor located on one side of the layer where the plurality of read signal lines are located facing away from the base substrate, and a transistor located between the base substrate and the layer where the plurality of read signal lines are located; the transistor comprises a gate arranged on a layer same with the layer where the gate line is, and a source and a drain located on one side of the gate facing away from the base substrate; and
   the plurality of read signal lines, the source and the drain are arranged on a same layer, the first sub-portions are located between the layer where the reset signal line is located and the layer where the source and the drain are located, and the second sub-portions are located between the layer where the source and the drain are located and a layer where the photosensor is located.

7. The display substrate according to claim 1, further comprising: a photosensor located on one side of the layer where the plurality of read signal lines are located facing away from the base substrate, and a transistor located between the base substrate and the layer where the plurality of read signal lines are located; wherein
   the photosensor comprises a first electrode, a photoelectric conversion layer and a second electrode sequentially arranged on one side of the layer where the plurality of read signal lines are located facing away from the base substrate in a stacked mode; and the first sub-portions are located between the transistor and the layer where the plurality of read signal lines are located, and the second sub-portions and the first electrode are arranged on a same layer.

8. The display substrate according to claim 1, further comprising: a photosensor located on one side of the layer where the plurality of read signal lines are located facing away from the base substrate; wherein the plurality of display signal lines are located on one side of a layer where the photosensor is located facing away from the base substrate; and the shielding layer is arranged between the layer where the photosensor is located and the layer where the plurality of display signal lines are located, wherein an orthographic projection of the shielding layer one the base substrate covers the base substrate.

9. A display panel, comprising a display substrate, wherein the display substrate comprises:

a base substrate;

a plurality of read signal lines, extending on the base substrate in a first direction;

a plurality of display signal lines, extending on the base substrate in a second direction, wherein the second direction intersects with the first direction, the plurality of display signal lines and the plurality of read signal lines are arranged on different layers, and there is an overlapped region between an orthographic projection of the plurality of display signal lines on the base substrate and an orthographic projection of the plurality of read signal lines; and a shielding layer arranged between a layer where the plurality of read signal lines are located and a layer where the plurality of display signal lines are located, wherein an orthographic projection of the shielding layer on the base substrate at least covers the overlapped region;

wherein the shielding layer comprises a plurality of shielding portions which are mutually independent, and an orthographic projection of each of the shielding portions on the base substrate completely covers an orthographic projection of a corresponding read signal line;

the plurality of display signal lines comprise a plurality of first display signal lines located between the base substrate and the layer where the plurality of read signal lines are located, and a plurality of second display signal lines located on one side of the layer where the plurality of read signal lines are located facing away from the base substrate; and the shielding portions comprise the first sub-portions and the second sub-portions, wherein the first sub-portions are located between a layer where the plurality of first display signal lines are located and the layer where the plurality of read signal lines are located, and the second sub-portions are located between a layer where the plurality of second display signal lines are located and the layer where the plurality of read signal lines are located; wherein the first sub-portions and the second sub-portions are electrically connected, and an orthographic projection of the second sub-portions on the base substrate is located in an orthographic projection of the first sub-portions;

wherein the display substrate further comprises: a first insulating layer located between a layer where the first sub-portions are located and the layer where the plurality of read signal lines are located, and a second insulating layer located between a layer where the second sub-portions are located and the layer where the plurality of read signal lines are located; and the first sub-portions and the second sub-portions are electrically connected through at least one through hole penetrating through the first insulating layer and the second insulating layer.

10. The display panel according to claim 9, wherein there are a plurality of through holes, and the plurality of through holes are formed in edges of two sides of an extending direction of the read signal lines respectively.

11. The display panel according to claim 10, wherein the base substrate comprises a display region, and a bezel region located around the display region; and the plurality of through holes are at least formed in the bezel region.

12. A display apparatus, comprising the display panel according to claim 9.

* * * * *